(12) United States Patent
Konno et al.

(10) Patent No.: US 10,347,553 B2
(45) Date of Patent: Jul. 9, 2019

(54) CERAMIC SUBSTRATE AND METHOD FOR MANUFACTURING THE SAME

(71) Applicant: Mitsubishi Electric Corporation, Chiyoda-ku (JP)

(72) Inventors: Nobuaki Konno, Chiyoda-ku (JP); Yoshiaki Hirata, Chiyoda-ku (JP); Yukihisa Yoshida, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/060,189

(22) PCT Filed: Dec. 7, 2016

(86) PCT No.: PCT/JP2016/086370
§ 371 (c)(1),
(2) Date: Jun. 7, 2018

(87) PCT Pub. No.: WO2017/134924
PCT Pub. Date: Aug. 10, 2017

(65) Prior Publication Data
US 2018/0366384 A1    Dec. 20, 2018

(30) Foreign Application Priority Data

Feb. 1, 2016 (JP) ................. 2016-016876

(51) Int. Cl.
*H05K 1/03* (2006.01)
*H05K 3/30* (2006.01)
(Continued)

(52) U.S. Cl.
CPC .......... *H01L 23/15* (2013.01); *H01L 21/4857* (2013.01); *H01L 23/13* (2013.01);
(Continued)

(58) Field of Classification Search
CPC ............................. H05K 1/0306; H05K 3/303
See application file for complete search history.

(56) References Cited

FOREIGN PATENT DOCUMENTS

| JP | 2007-96285 A | 4/2007 |
|---|---|---|
| JP | 2007-214183 A | 8/2007 |

(Continued)

OTHER PUBLICATIONS

International Search Report dated Feb. 28, 2017 in PCT/JP2016/086370 filed Dec. 7, 2016.

*Primary Examiner* — Jeremy C Norris
(74) *Attorney, Agent, or Firm* — Oblon, McClelland, Maier & Neustadt, L.L.P.

(57) ABSTRACT

Each of a plurality of ceramic substrate members includes a via reaching an other main surface from one main surface. A gap is formed in each of first and second ceramic substrate members of the plurality of stacked ceramic substrate members to penetrate each of the first and second ceramic substrate members, the first ceramic substrate member being arranged at an outermost surface on one side in a stacking direction of the ceramic substrate members, the second ceramic substrate member being arranged at an outermost surface on the other side opposite to the one side in the stacking direction. At least a portion of a side surface and a bottom surface within the gap are covered with a protection layer. The protection layer is made of a material having an etching rate lower than that of the ceramic substrate members.

15 Claims, 10 Drawing Sheets

(51) Int. Cl.
*H01L 23/15* (2006.01)
*H01L 23/13* (2006.01)
*H05K 1/02* (2006.01)
*H05K 3/46* (2006.01)
*H01L 21/48* (2006.01)
*H01L 23/498* (2006.01)
*H01L 21/66* (2006.01)

(52) U.S. Cl.
CPC .............. *H05K 1/02* (2013.01); *H05K 1/0306* (2013.01); *H05K 3/303* (2013.01); *H05K 3/46* (2013.01); *H05K 3/4629* (2013.01); *H01L 22/30* (2013.01); *H01L 23/49822* (2013.01)

(56) References Cited

FOREIGN PATENT DOCUMENTS

| | | |
|---|---|---|
| JP | 2007-251017 A | 9/2007 |
| JP | 2010-283074 A | 12/2010 |
| JP | 2013-30759 A | 2/2013 |
| JP | 2014-175567 A | 9/2014 |

CERAMIC SUBSTRATE AND METHOD FOR MANUFACTURING THE SAME

TECHNICAL FIELD

The present invention relates to a ceramic substrate and a method for manufacturing the same. In particular, the present invention relates to a low-temperature co-fired ceramic stacked substrate and a method for manufacturing the same.

BACKGROUND ART

As electric signals have higher frequencies, Low Temperature Co-fired Ceramic (LTCC) substrates have been widely used. The LTCC substrates are substrates made of LTCC for which a metal material having a low conductor resistance can be used and which can be fired at a low temperature of less than or equal to 1000° C. LTCC stands for Low Temperature Co-fired Ceramic. An LTCC substrate is formed by providing a via for conduction within a via hole processed in a green sheet thereof, stacking a plurality of the green sheets provided with the vias, and co-firing a ceramic material constituting the green sheets and a conductor material constituting the vias. Thereby, a high-density multilayer substrate can be formed at low cost. Since LTCC has a dielectric constant of more than or equal to about 5 and less than or equal to about 7, and passive elements such as a resistor and a capacitor can be embedded therein, it is suitable for use in high frequency digital applications.

Here, a case of forming a module in which an LTCC substrate is used to seal a power device or a MEMS (Micro Electro Mechanical Systems) structural body is considered. On this occasion, there is a case where an LTCC substrate is used to seal a device formed on a silicon substrate, and the LTCC substrate is provided with a cavity for storing the device, as described for example in Japanese Patent Laying-Open No. 2013-30759 (PTD 1). Further, there is also a case where a cavity is formed in an LTCC stacked substrate and a chip component is mounted within the cavity, as described for example in Japanese Patent Laying-Open No. 2010-283074 (PTD 2).

CITATION LIST

Patent Document

PTD 1: Japanese Patent Laying-Open No. 2013-30759
PTD 2: Japanese Patent Laying-Open No. 2010-283074

SUMMARY OF INVENTION

Technical Problem

Whether an LTCC substrate is used on a side where a device is installed or a side where the device is sealed in a module in which a MEMS structural body or the like is sealed, it is required to polish a surface of the LTCC substrate at which the LTCC substrate is bonded to another member by sealing to have a smaller surface roughness, in particular in the case of establishing airtight sealing. Further, also in a case where an electrode, a wire, or the like is formed on a surface of an LTCC substrate, polishing for reducing the surface roughness of the LTCC substrate may be required.

In a case where an LTCC substrate is used for sealing as in Japanese Patent Laying-Open No. 2013-30759, for example, polishing the LTCC substrate causes a change in the thickness of the polished LTCC stacked substrate. When an internal circuit is formed in the portion having the change in thickness, the value of a capacitance or the like of the internal circuit change, affecting the properties of the internal circuit. Accordingly, it is more preferable that a stacked substrate can be formed while measuring and controlling the thickness of the stacked substrate.

However, in a case where an LTCC substrate is used for mounting a device as in Japanese Patent Laying-Open No. 2010-283074, for example, green sheets are deformed when forming the LTCC substrate having a stacked structure, and the shape of a level difference of a cavity for storing the device becomes deformed. Accordingly, although the cavity can be used for mounting the device, it is difficult to use the cavity for measuring the thickness of the stacked LTCC substrate.

The present invention has been made in view of the aforementioned problem, and an object of the present invention is to provide a ceramic substrate having a cavity which can be used for measuring the thickness of the substrate, and a method for manufacturing the same.

Solution to Problem

A ceramic substrate of the present invention includes a plurality of stacked ceramic substrate members. Each of the plurality of ceramic substrate members includes a via reaching the other main surface from one main surface. A gap is formed in each of first and second ceramic substrate members of the plurality of stacked ceramic substrate members to penetrate each of the first and second ceramic substrate members, the first ceramic substrate member being arranged at an outermost surface on one side in a stacking direction of the ceramic substrate members, the second ceramic substrate member being arranged at an outermost surface on the other side opposite to the one side in the stacking direction. At least a portion of a side surface and a bottom surface within the gap are covered with a protection layer. The protection layer is made of a material having an etching rate lower than that of the ceramic substrate members.

In a method for manufacturing a ceramic substrate of the present invention, first, first and second green sheets and first and second inner layer green sheets are prepared. A via is formed in each of the first and second green sheets and the first and second inner layer green sheets. A side surface protection portion is formed at an outer peripheral portion of a region to serve as a gap. A bottom surface protection portion is formed to include an entire region to be surrounded by the side surface protection portion in plan view, to be able to be adjacent on a side of the side surface protection portion closer to the first or second inner layer green sheet. The first and second green sheets and the first and second inner layer green sheets are stacked. These green sheets are fired, and first and second ceramic substrate members and first and second inner layer ceramic substrate members are formed. After the firing, a portion of each of the first and second ceramic substrate members in the region to serve as the gap surrounded by the side surface protection portion is etched and removed, and the gap penetrating each of the first and second ceramic substrate members is formed. The side surface protection portion and the bottom surface protection portion are made of a material having an etching rate lower than that of the first and second ceramic substrate members.

Advantageous Effects of Invention

According to the ceramic substrate and the method for manufacturing the same of the present invention, the thickness of each of the first and second ceramic substrate members after the stacking and the firing can be measured with high accuracy, using the gap as a cavity penetrating each of the first and second ceramic substrate members.

DESCRIPTION OF EMBODIMENTS

Hereinafter, embodiments of the present invention will be described based on the drawings.

First Embodiment

Figure 1:
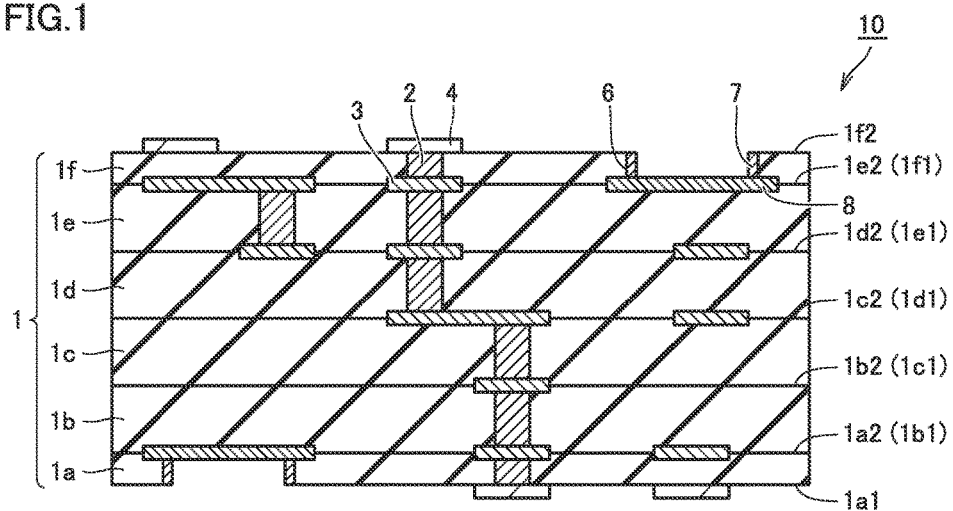
FIG. 1 is a schematic cross sectional view showing a configuration of a ceramic substrate in a first embodiment.
Figure 2:
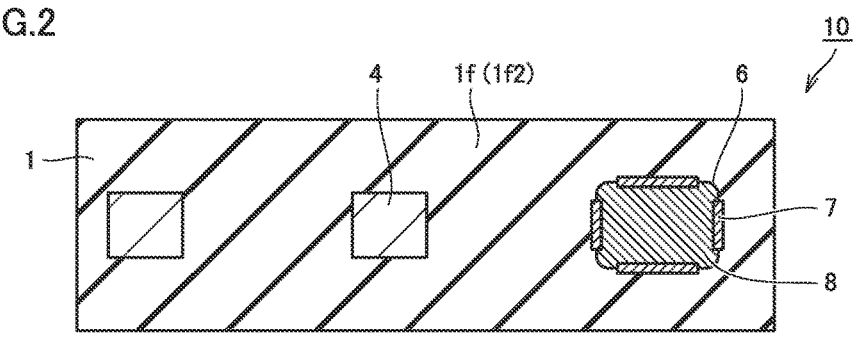
FIG. 2 is a schematic plan view showing a manner in which the ceramic substrate of FIG. 1 is viewed from the top in plan view.

First, a configuration of a ceramic substrate in the present embodiment will be described using FIGS. 1 to 4. Referring to FIGS. 1 and 2, a ceramic substrate 10 in the present embodiment has a role in sealing a substrate having an electronic circuit, a MEMS structural body, or the like formed thereon, by being connected to face the substrate having the MEMS structural body or the like formed thereon, in order to form a module, for example.

Ceramic substrate 10 includes a plurality of stacked ceramic substrate members 1 each having one main surface and the other main surface opposite to the one main surface. Specifically, ceramic substrate 10 has a plurality of, here six ceramic substrate members $1a$, $1b$, $1c$, $1d$, $1e$, and $1f$, as ceramic substrate members 1, and has a configuration in which ceramic substrate members $1a$, $1b$, $1c$, $1d$, $1e$, and $1f$ are stacked in this order from a lower layer to an upper layer. However, the number of stacked ceramic substrate members is not limited thereto, and ceramic substrate 10 may have a configuration in which five or seven ceramic substrate members are stacked.

Ceramic substrate member $1a$ is a flat plate-shaped member having one main surface $1a1$ and the other main surface $1a2$ opposite thereto. Similarly, ceramic substrate member $1b$ is a flat plate-shaped member having one main surface $1b1$ and the other main surface $1b2$ opposite thereto. Ceramic substrate member $1c$ is a flat plate-shaped member having one main surface $1c1$ and the other main surface $1c2$ opposite thereto. Ceramic substrate member $1d$ is a flat plate-shaped member having one main surface $1d1$ and the other main surface $1d2$ opposite thereto. Ceramic substrate member $1e$ is a flat plate-shaped member having one main surface $1e1$ and the other main surface $1e2$ opposite thereto. Ceramic substrate member $1f$ is a flat plate-shaped member having one main surface $1f1$ and the other main surface $1f2$ opposite thereto.

In FIG. 1, one main surfaces $1a1$ to $1f1$ are arranged to face downward in the drawing, and the other main surfaces $1a2$ to $1f2$ are arranged to face upward in the drawing. Accordingly, ceramic substrate members $1a$ and $1b$ are stacked such that the other main surface $1a2$ of ceramic substrate member $1a$ and one main surface $1b1$ of ceramic substrate member $1b$ are in contact with each other. Similarly, ceramic substrate members $1b$ and $1c$ are stacked such that the other main surface $1b2$ of ceramic substrate member $1b$ and one main surface $1c1$ of ceramic substrate member $1c$ are in contact with each other. Ceramic substrate members $1c$ and $1d$ are stacked such that the other main surface $1c2$ of ceramic substrate member $1c$ and one main surface $1d1$ of ceramic substrate member $1d$ are in contact with each other. Ceramic substrate members $1d$ and $1e$ are stacked such that the other main surface $1d2$ of ceramic substrate member $1d$ and one main surface $1e1$ of ceramic substrate member $1e$ are in contact with each other. Ceramic substrate members $1e$ and $1f$ are stacked such that the other main surface $1e2$ of ceramic substrate member $1e$ and one main surface $1f1$ of ceramic substrate member $1f$ are in contact with each other.

The plurality of ceramic substrate members $1a$, $1b$, $1c$, $1d$, $1e$, and $1f$ include through vias 2 serving as vias reaching the other main surfaces $1a2$ to $1f2$ from one main surfaces $1a1$ to $1f1$, respectively. Specifically, each of ceramic substrate members $1a$ to $1f$ has at least one layer of through via 2 in a partial region therein. In addition, ceramic substrate members $1a$ to $1e$ have internal wires 3 formed in partial regions on the other main surfaces $1a2$ to $1e2$, respectively. Although internal wire 3 is formed to cover through via 2, for example, the present invention is not limited to such a manner.

Of the plurality of ceramic substrate members $1a$ to $1f$ constituting ceramic substrate 10, a first ceramic substrate member arranged on one side in a stacking direction of ceramic substrate members 1, that is, arranged at an outermost surface on a lower side in FIG. 1, is assumed as ceramic substrate member 1a. In addition, a second ceramic substrate member arranged on the other side opposite to the one side in the stacking direction of ceramic substrate members 1, that is, arranged at an outermost surface on an upper side in FIG. 1, is assumed as ceramic substrate member 1f. On this occasion, electrodes 4 are formed on one main surface 1a1 of lowermost ceramic substrate member 1a arranged on the one side, and on the other main surface 1f2 of uppermost ceramic substrate member 1f arranged on the other side. Electrodes 4 are formed at portions of one main surface 1a1 and the other main surface 1f2. Although electrode 4 is arranged to cover internal wire 3 formed on each of ceramic substrate member 1a and ceramic substrate member 1f, for example, the present invention is not limited to such a manner.

Through vias 2, internal wires 3, and electrodes 4 are each formed of a conductor material. In addition, in a central portion in a right-left direction of FIG. 1, for example, through vias 2, internal wires 3, and electrodes 4 are connected with each other, and thereby all elements from electrode 4 on one main surface 1a1 to electrode 4 on the other main surface 1f2 are electrically connected. A circuit such as an inductance is formed of such an electrically connected region. Alternatively, the region in which through vias 2, internal wires 3, and electrodes 4 are electrically connected with each other is a region for extracting an electric signal directly or through an internal circuit, from the substrate having the electronic circuit, the MEMS structural body, or the like mounted thereon which faces ceramic substrate 10 in the module using ceramic substrate 10. Further, each of ceramic substrate members 1, that is, ceramic substrate members 1a to 1f, is formed of an insulating material. Accordingly, a circuit such as a capacitance is formed of a combination of through via 2 and ceramic substrate member 1, for example.

A gap 6 is formed in each of ceramic substrate member 1a serving as the first ceramic substrate member and ceramic substrate member 1f serving as the second ceramic substrate member, of the plurality of stacked ceramic substrate members 1a to 1f. Gaps 6 are regions from which a constituent material for ceramic substrate members 1a and 1f has been removed, which are formed in a partial region of one main surface 1a1 in ceramic substrate member 1a and in a partial region of the other main surface 1f2 in ceramic substrate member 1f. Further, gaps 6 extend from one main surface 1a1 to the other main surface 1a2 in ceramic substrate member 1a to penetrate therethrough, and extend from the other main surface 1f2 to one main surface 1f1 in ceramic substrate member 1f to penetrate therethrough.

A side surface within gap 6 is covered with a side surface protection portion 7 serving as a protection layer, and a bottom surface within gap 6 is covered with a bottom surface protection portion 8 serving as a protection layer. Specifically, the side surface of gap 6 is a surface which extends from the one main surface toward the other main surface of ceramic substrate member 1a or 1f, of inner wall surfaces constituting the inside of gap 6, and the bottom surface of gap 6 is a surface which extends along the other main surface 1a2 or one main surface 1f1 and corresponds to a bottom portion of gap 6, of the inner wall surfaces constituting the inside of gap 6. More specifically, the protection layer for gap 6 includes side surface protection portion 7 covering the side surface within gap 6, and bottom surface protection portion 8 covering the bottom surface within gap 6. In other words, gap 6 has a configuration in which it is covered with and surrounded by side surface protection portion 7 and bottom surface protection portion 8.

Bottom surface protection portion 8 extends more outward than side surface protection portion 7, in plan view. More specifically, as shown in FIG. 1, bottom surface protection portion 8 extends from a region to the left of left side surface protection portion 7 of a pair of side surface protection portions 7 shown in FIG. 1, to a region to the right of right side surface protection portion 7 in FIG. 1, while including a region surrounded by side surface protection portions 7. Conversely, side surface protection portion 7 is formed to extend immediately upward or downward from bottom surface protection portion 8 at a portion inside an outermost portion of bottom surface protection portion 8 in the right-left direction of FIG. 1.

It should be noted that, in the present embodiment, side surface protection portion 7 is formed to cover only portions of the side surface within gap 6, as shown in FIG. 2. Therefore, side surface protection portion 7 serving as the protection layer is formed to cover at least a portion of the side surface within gap 6. In FIG. 2, in plan view, an outer edge of gap 6 substantially has the shape of a rectangle with rounded corners, and side surface protection portion 7 is formed to cover central portions of linearly extending sides which constitute the rectangle. However, the present invention is not limited to such a manner, and side surface protection portion 7 may be formed in regions adjacent to corners of gap 6 in plan view, for example. It should be noted that planar shapes of gap 6, electrode 4, and the like are each not limited to (a shape close to) a rectangle shown in FIG. 2, and can be any planar shape such as an ellipse or a circle, for example.

Side surface protection portion 7 and bottom surface protection portion 8 serving as the protection layer are preferably electrically separated from electrode 4. In other words, side surface protection portion 7 and bottom surface protection portion 8 are preferably electrically independent of electrode 4. More specifically, although side surface protection portion 7 and bottom surface protection portion 8 are formed of a conductor material, they are preferably not electrically connected with electrode 4. Further, side surface protection portion 7 and bottom surface protection portion 8 are also preferably electrically independent of through via 2 and internal wire 3.

Preferably, the maximum value of the width of gap 6 in plan view is less than or equal to 1 mm. It should be noted that the maximum value of the width of gap 6 used herein refers to the width of a portion of gap 6 having the maximum dimension in plan view. More specifically, for example in FIG. 2, gap 6 has the maximum dimension in an oblique direction, which is a direction obliquely extending with respect to directions in which the outer edge thereof extends, in plan view. Accordingly, the width of gap 6 in the oblique direction is preferably less than or equal to 1 mm. However, the width of the outer edge of gap 6 in the right-left direction of FIG. 2 may be less than or equal to 1 mm. For example, when the planar shape of gap 6 is a circle, its diameter is preferably less than or equal to 1 mm, and when the planar shape of gap 6 is an ellipse, the length of its major axis is preferably less than or equal to 1 mm.

By setting the size of gap 6 in plan view to such an extent, the ratio of an area occupied by gaps 6 in the module formed using ceramic substrate 10 can be decreased. This can further reduce such an influence that a region in which a circuit or the like can be arranged within the module is decreased due to the presence of gaps 6. In addition, by setting the above dimension of gap 6 to less than or equal to 1 mm, an increase in a protrusion height of the side surface and the bottom surface within gap 6 can be suppressed, as described later.

Further, since gap 6 has the above size in plan view, it is clear that gap 6 is not formed for storing a semiconductor element or the like therein, but gap 6 is intended to be used for measuring a thickness from one main surface 1a1, 1f1 to the other main surface 1a2, 1f2 of ceramic substrate member 1a, 1f. To measure the thickness of ceramic substrate member 1a, 1f using gap 6, an optical microscope such as a laser microscope or an optical interference microscope is used, and measurement is performed by observing gap 6. Accordingly, from the viewpoint of allowing entire gap 6 to come within the field of view as a measurement range, the maximum value of the dimension of gap 6 in plan view is preferably less than or equal to 1 mm, as described above.

Figure 3:
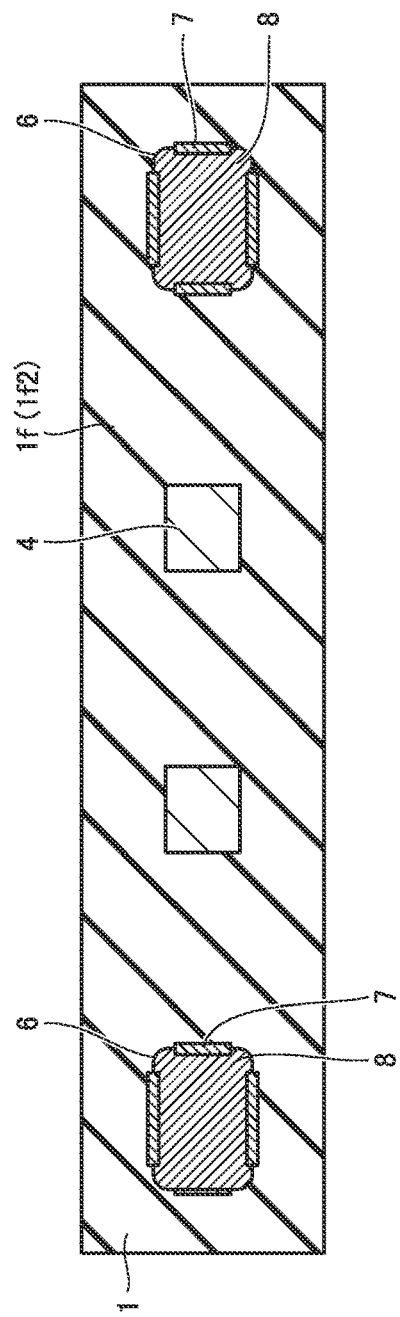
FIG. 3 is a schematic plan view showing a manner in which the ceramic substrate in the first embodiment is viewed from the top in plan view, as a variation different from the manner shown in FIG. 2.

In FIGS. 1 and 2, one gap 6 is formed in each of ceramic substrate members 1a and 1f. However, referring to FIG. 3, more preferably, a plurality of (two in FIG. 3) gaps 6 are formed in each of ceramic substrate member 1a serving as the first ceramic substrate member and ceramic substrate member 1f serving as the second ceramic substrate member. It should be noted that, more preferably, gaps 6 more than those shown in FIG. 3 are arranged in each of the four directions of the rectangle in ceramic substrate member 1f in plan view in FIG. 3. Thereby, distribution of the thickness from one main surface 1a1, 1f1 to the other main surface 1a2, 1f2 of ceramic substrate member 1a, 1f among regions in plan view can be measured.

Figure 4:
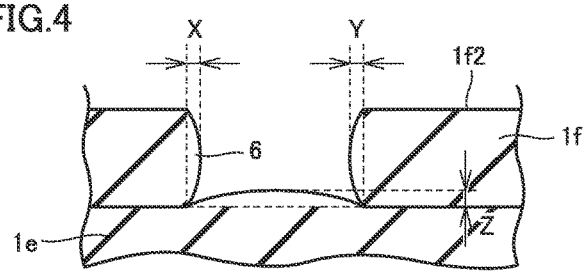
FIG. 4 is an enlarged schematic cross sectional view showing the shape of a gap shown in FIG. 1 in more detail.

Referring to FIG. 4, in the present embodiment, the protrusion height of the side surface and the bottom surface within gap 6 formed in each of ceramic substrate members 1a and 1f is preferably less than or equal to 2 μm. It should be noted that, in FIG. 4, side surface protection portion 7 and bottom surface protection portion 8 are not shown for simplification and clarification of the drawing. Specifically, dotted lines present in regions adjacent to the side surface and the bottom surface of gap 6 in FIG. 4 indicate the side surface and the bottom surface of gap 6 when they are not curved at all. In contrast, the actual side surface and bottom surface of gap 6 are curved to face the inside of gap 6 as shown in the drawing, for example. Thus, when a flat surface indicated by the dotted lines in FIG. 4 connecting vertices of gap 6 is assumed, a maximum height (distance) of a portion most protruding therefrom due to curving is defined herein as the protrusion height of the side surface and the bottom surface.

The above protrusion height is indicated in FIG. 4 as maximum value X, Y of a curved amount of the side surface of gap 6, and a maximum value Z of a curved amount of the bottom surface of gap 6. Here, the value of X, Y, Z is preferably less than or equal to 2 μm, as described above. It should be noted that protrusion height X, Y, Z is more preferably less than or equal to 1.5 μm, and is further preferably less than or equal to 1 μm.

Since gap 6 is formed such that the protrusion height therein is decreased as described above, the thickness of ceramic substrate member 1a, 1f can be measured more accurately using gap 6 in the present embodiment.

Next, a material for each member constituting ceramic substrate 10 described above will be described.

It is only necessary that the main constituent material for ceramic substrate members 1, that is, stacked ceramic substrate members 1a to 1f, is a ceramic material, and ceramic substrate members 1 can be formed of any ceramic material. However, more preferably, ceramic substrate members 1a to 1f are each a substrate including a flat plate-shaped body portion made of low-temperature co-fired ceramic (LTCC) formed using alumina as the main constituent material. More specifically, ceramic substrate members 1a to 1f are formed by firing through vias 2, internal wires 3, and the like formed therein simultaneously with LTCC, which is the material constituting a body of the ceramic substrate, as described later. Further, by simultaneously firing all the plurality of stacked ceramic substrate members 1a to 1f, ceramic substrate members 1a to 1f are bonded, and thereby ceramic substrate 10 is formed.

When the body portion of each of ceramic substrate members 1a to 1f is made of LTCC, through via 2 and internal wire 3 included therein are preferably made of a metal material having a low conductor resistance. Specifically, through via 2 and internal wire 3 are preferably formed of any material selected from the group consisting of gold, platinum, silver, and copper.

Side surface protection portion 7 and bottom surface protection portion 8 serving as the protection layer within gap 6 are formed of a material having a high chemical resistance. More specifically, side surface protection portion 7 and bottom surface protection portion 8 may be made of a material having an etching rate lower than that of ceramic substrate members 1, with respect to at least one type of etching solution, of types of solutions capable of etching the main constituent material for ceramic substrate members 1, for example. Specifically, side surface protection portion 7 and bottom surface protection portion 8 are preferably formed of gold. However, side surface protection portion 7 and bottom surface protection portion 8 within gap 6 may also be formed of the same material as that for through via 2 and internal wire 3 described above. Specifically, side surface protection portion 7 and bottom surface protection portion 8 may be formed of any material selected from the group consisting of gold, platinum, silver, and copper. Thereby, side surface protection portion 7 or bottom surface protection portion 8 can be formed simultaneously with through via 2 or internal wire 3, and thus the number of steps can be reduced.

Next, a method for manufacturing ceramic substrate 10 in the present embodiment will be described using FIGS. 5 to 9.

Figure 5:
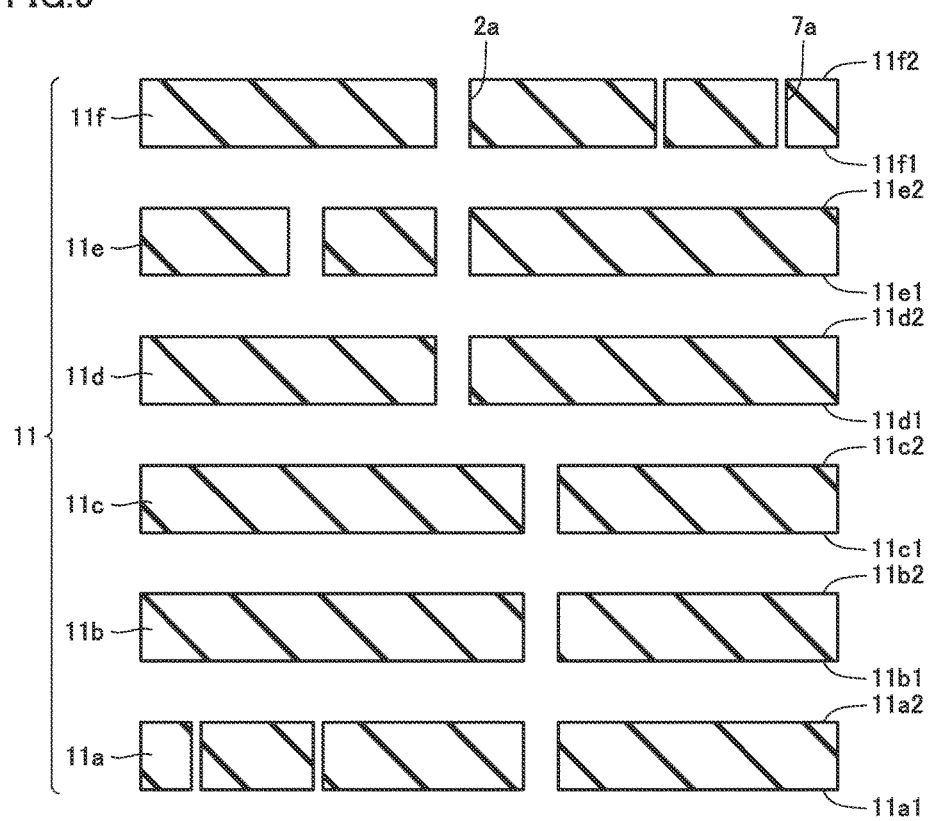
FIG. 5 is a schematic cross sectional view showing a first step of a method for manufacturing the ceramic substrate in the first embodiment.

Referring to FIG. 5, first, green sheets 11 are prepared, which correspond to ceramic substrate members 1a to 1f (see FIG. 1) mutually stacked to constitute ceramic substrate 10 that are in a state before being fired. More specifically, when six ceramic substrate members 1a to 1f are stacked, for example, green sheets 11a to 11f in the same number as the number of the ceramic substrate members are prepared as green sheets 11, to correspond to these six ceramic substrate members. Green sheets 11a, 11b, 11c, 11d, 11e, and 11f before being fired correspond to ceramic substrate members 1a, 1b, 1c, 1d, 1e, and 1f after being fired, respectively.

Of these green sheets 11a to 11f, green sheet 11a is a flat plate-shaped member having one main surface 11a1 and the other main surface 11a2 opposite thereto corresponding to one main surface 1a1 and the other main surface 1a2 after being fired, respectively. Similarly, green sheet 11b is a flat plate-shaped member having one main surface 11b1 and the other main surface 11b2 corresponding to one main surface 1b1 and the other main surface 1b2 after being fired, respectively. Green sheet 11c is a flat plate-shaped member having one main surface 11c1 and the other main surface 11c2 corresponding to one main surface 1c1 and the other main surface 1c2 after being fired, respectively. Green sheet 11d is a flat plate-shaped member having one main surface 11d1 and the other main surface 11d2 corresponding to one main surface 1d1 and the other main surface 1d2 after being fired, respectively. Green sheet 11e is a flat plate-shaped member having one main surface 11e1 and the other main surface 11e2 corresponding to one main surface 1e1 and the other main surface 1e2 after being fired, respectively. Green sheet 11f is a flat plate-shaped member having one main surface 11f1 and the other main surface 11f2 corresponding to one main surface 1f1 and the other main surface 1f2 after being fired, respectively.

It should be noted that, here, green sheet 11a formed as a lowermost layer after stacking described later is referred to as a first green sheet, and green sheet 11f formed as an uppermost layer after the stacking is referred to as a second green sheet. Further, green sheet 11b which can be stacked to be adjacent on a side of the other main surface 11a2 of green sheet 11a serving as the first green sheet is referred to as a first inner layer green sheet, and green sheet 11e which can be stacked to be adjacent on a side of one main surface 11f1 of green sheet 11f serving as the second green sheet is referred to as a second inner layer green sheet. Furthermore, hereinafter, the green sheets will be designated by the reference signs for green sheets 11a to 11f even when they are in an unfinished state.

Green sheets 11a to 11f are prepared by processing green sheets for an LTCC substrate. A green sheet for an LTCC substrate is formed by blending and mixing ceramic powder, glass, and other materials to prepare a raw material, adding an organic binder and a solvent to the raw material to prepare slurry, applying the slurry on an organic film to have the shape of a flat plate, and drying the same. The thickness of each of green sheets 11a to 11f for the LTCC substrate is preferably more than or equal to 20 µm and less than or equal to 200 µm, for example.

It should be noted that there may be a case where ceramic substrate 10 made of these green sheets 11a to 11f is finally bonded by anodic bonding to a member made of a material different from that for the LTCC substrate, such as a silicon substrate having an electronic circuit, a MEMS structural body, or the like formed thereon. In this case, it is preferable to use a material containing alkali metal ions such as sodium ions or lithium ions, as the glass to be mixed in the raw material for green sheets 11a to 11f.

Next, a plurality of through holes 2a are formed in each of the plurality of green sheets 11a to 11f formed in the shape of a flat plate. Through holes 2a are holes formed to reach the other main surfaces 11a2 to 11f2 from one main surfaces 11a1 to 11f1 of green sheets 11a to 11f, respectively, to form through vias 2 (see FIG. 1). Although through holes 2a may have any shape when one main surfaces 11a1 to 11f1 and the like are viewed in plan view, through holes 2a preferably have the shape of a circle or a rectangle, for example. The maximum value of the width of through hole 2a in plan view is preferably more than or equal to 20 µm and less than or equal to 200 µm, for example, and is preferably equal to the thickness of each of green sheets 11a to 11f for the LTCC substrate. The maximum value of the width of through hole 2a used herein refers to the width of a portion of through hole 2a having the maximum dimension in plan view, based on the same definition as that for the maximum value of the width of gap 6 described above.

Through holes 2a are formed by punching or laser, for example. Further, protection portion through holes 7a for forming side surface protection portion 7 (see FIG. 1) are formed at portions in plan view of an outer peripheral portion of a region where gap 6 (see FIG. 1) should be formed in each of green sheet 11a and green sheet 11f, as described later. Protection portion through holes 7a are formed by the same method as that for through holes 2a, and are formed to reach the other main surface 11a2, 11f2 from one main surface 11a1, 11f1 of green sheet 11a, 11f. Protection portion through hole 7a is formed such that its dimension in the right-left direction of FIG. 5 is smaller than that of through hole 2a. The dimension of protection portion through hole 7a in the right-left direction of FIG. 5 is formed, considering that it corresponds to the thickness of side surface protection portion 7 (see FIG. 1) formed later.

Protection portion through holes 7a are formed to cover only portions of the outer peripheral portion of the region to serve as gap 6. This is because, if protection portion through holes 7a are formed to entirely cover the outer peripheral portion of the region to serve as gap 6, for example, the entire region to serve as gap 6 is separated from green sheet 11a, 11f together with regions removed by the formation of protection portion through holes 7a, and thus desired protection portion through holes 7a cannot be formed. If the entire region to serve as gap 6 is separated and removed from the green sheet in this stage, there may occur such a defect that a conductive member is charged into the region to serve as gap 6 during the subsequent step of charging the conductive member for forming side surface protection portion 7. Therefore, from the viewpoint of preventing such a defect, it is preferable to form protection portion through holes 7a at only portions of the outer peripheral portion, so as to be discontinuous in directions in which the outer peripheral portion extends, for example.

Figure 6:
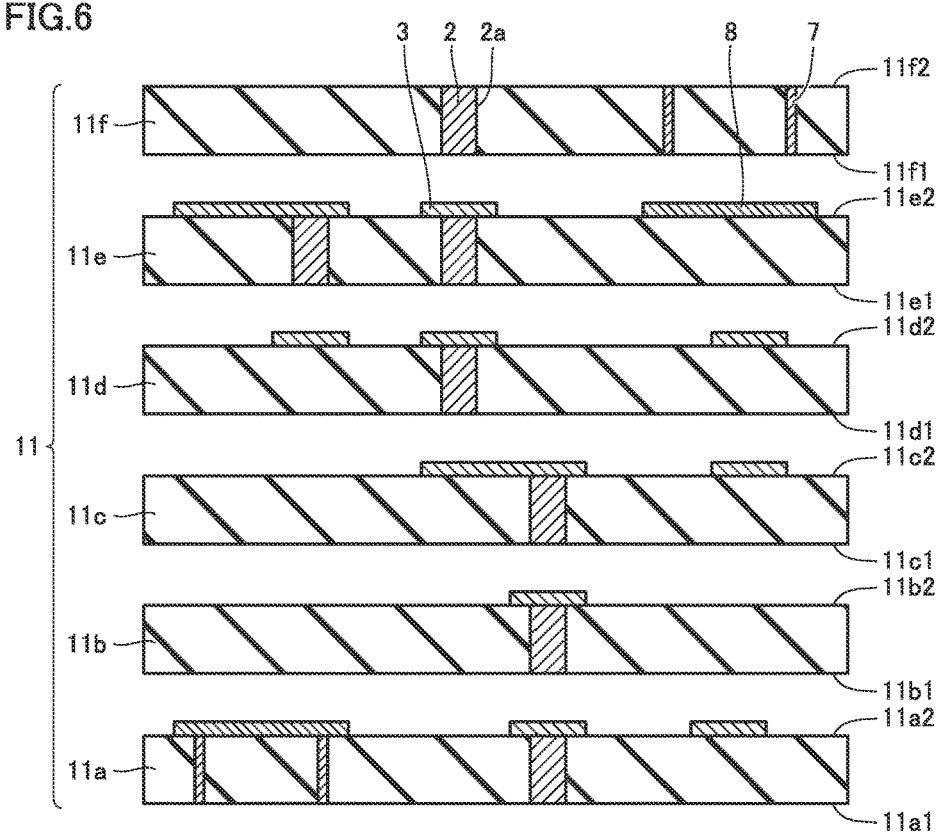
FIG. 6 is a schematic cross sectional view showing a second step of the method for manufacturing the ceramic substrate in the first embodiment.

Referring to FIG. 6, next, the conductive member is charged into through holes 2a and protection portion through holes 7a. Any method can be adopted as a method for charging the conductive member, and screen printing is preferably used, for example. When the conductive member is charged into entire through holes 2a, the conductive member is formed as through vias 2 serving as vias reaching the other main surfaces 11a2 to 11f2 from one main surfaces 11a1 to 11f1 of green sheets 11a to 11f, respectively. In this manner, through vias 2 reaching the other main surfaces 11a2, 11f2, 11b2, and 11e2 from one main surfaces 11a1, 11f1, 11b1, and 11e1 are formed in green sheet 11a which is the first green sheet, green sheet 1 if which is the second green sheet, green sheet 11b which is the first inner layer green sheet, and green sheet 11e which is the second inner layer green sheet, respectively.

Further, since the conductive member is charged into entire protection portion through holes 7a by means of the above processing, side surface protection portion 7 reaching the other main surface 11a2, 11f2 from one main surface 11a1, 11f1 of green sheet 11a, 11f is formed. As described above, protection portion through holes 7a are formed to cover only portions of the outer peripheral portion of the region to serve as gap 6. Therefore, side surface protection portion 7 is formed to cover only portions of the outer peripheral portion of the region to serve as gap 6.

In addition, internal wires 3 are formed on the other main surfaces 11a2 to 11e2 of green sheets 11a to 11e, for example, to cover through vias 2. Thereby, through via 2 and internal wire 3 are electrically connected with each other. It should be noted that internal wire 3 may also be partially formed on the other main surface 11f2 of green sheet 11f. Further, although internal wires 3 are formed on the other main surfaces 11a2 to 11e2 in FIG. 6, internal wires 3 may be formed on one main surfaces 11a1 to 11f1.

It should be noted that the members such as through via 2 and internal wire 3, except for green sheet 11, will be herein designated by the names and reference signs which are identical both before and after firing.

Simultaneously with the formation of these internal wires 3, bottom surface protection portion 8 is formed to include an entire region to be surrounded by side surface protection portion 7 in plan view, to be able to be adjacent on a side of side surface protection portion 7 closer to the first or second inner layer green sheet, that is, closer to green sheet 11$b$ or 11$b$. As with internal wires 3, bottom surface protection portions 8 are formed on the other main surface 11$a$2 of green sheet 11$a$ and on the other main surface 11$e$2 of green sheet 11$e$, for example. Thereby, bottom surface protection portion 8, which includes the entire region to be surrounded by side surface protection portion 7 and can extend toward the outside of side surface protection portion 7 in plan view by the stacking of the green sheets, is formed on the other main surface 11$e$2 of green sheet 11$e$, for example.

It should be noted that it is only necessary for bottom surface protection portion 8 to be able to be adjacent, that is, to be able to be electrically connected, on the side of side surface protection portion 7 closer to the first or second inner layer green sheet. Accordingly, although bottom surface protection portion 8 adjacent to side surface protection portion 7 in green sheet 11$a$ is formed on the other main surface 11$a$2 of green sheet 11$a$ in FIG. 6, for example, bottom surface protection portion 8 may be formed on one main surface 11$b$1 of green sheet 11$b$. Similarly, although bottom surface protection portion 8 adjacent to side surface protection portion 7 in green sheet 11$f$ is formed on the other main surface 11$e$2 of green sheet 11$e$ in FIG. 6, for example, bottom surface protection portion 8 may be formed on one main surface 11$f$1 of green sheet 11$f$.

Internal wires 3 and bottom surface protection portions 8 can be formed by any film formation method, and can be formed by screen printing, sputtering, or vapor deposition, for example. It should be noted that, for example in green sheet 11$a$, all of through via 2, side surface protection portion 7, internal wire 3, and bottom surface protection portion 8 may be collectively formed by screen printing. However, at any rate, side surface protection portion 7 and bottom surface protection portion 8 are made of a material having an etching rate lower than that of ceramic substrate members 1$a$ and 1$f$, with respect to at least one type of types of solutions capable of etching the main constituent material for ceramic substrate members 1, in particular ceramic substrate members 1$a$ and 1$f$, for example. Specifically, side surface protection portion 7 and bottom surface protection portion 8 are preferably formed of gold.

Figure 7:
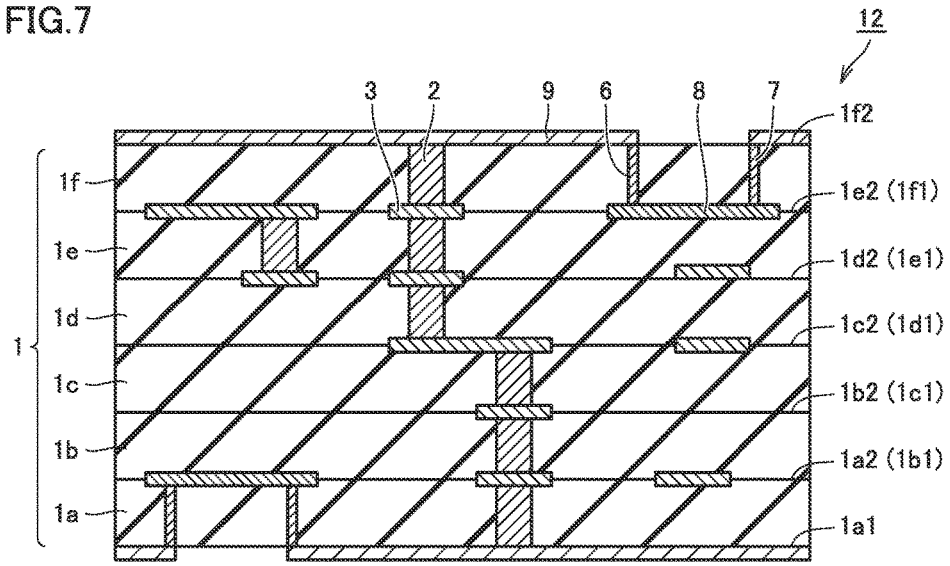
FIG. 7 is a schematic cross sectional view showing a third step of the method for manufacturing the ceramic substrate in the first embodiment.

Referring to FIG. 7, the plurality of green sheets 11$a$, 11$b$, 11$c$, 11$d$, 11$e$, and 11$f$ are stacked in this order, from the lower side to the upper side in the drawing. In all of these green sheets 11$a$ to 11$f$, one main surfaces 11$a$1 to 11$f$1 face downward in the drawing, and the other main surfaces 11$a$2 to 11$f$2 face upward in the drawing. Accordingly, green sheets 11$a$ and 11$b$ are stacked such that the other main surface 11$a$2 of green sheet 11$a$ and one main surface 11$b$1 of green sheet 11$b$ are in contact with each other. Similarly, the green sheets are stacked such that the other main surfaces 11$b$2 to 11$e$2 of green sheets 11$b$ to 11$e$ and one main surfaces 11$c$1 to 11$f$1 of green sheets 11$c$ to 11$f$ are in contact with each other, respectively. Thereby, green sheets 11$a$ and 11$f$ serving as the first and second green sheets and green sheets 11$b$ and 11$e$ serving as the first and second inner layer green sheets are stacked.

It should be noted that, in the present embodiment, the step of forming side surface protection portion 7 in FIG. 6 is performed before the step of stacking in FIG. 7. Therefore, as described above, side surface protection portion 7 is formed to cover only portions of the outer peripheral portion of the region to serve as gap 6, in order to suppress the entire portion surrounded by side surface protection portion 7 from dropping off due to the formation of protection portion through holes 7$a$ for forming side surface protection portion 7.

Next, green sheets 11$a$ to 11$f$ are co-fired at a temperature of less than or equal to 1000° C. while applying pressure thereto, such that the mutually contacting main surfaces of green sheets 11$a$ to 11$f$ stacked as described above are in closer contact with each other. Thereby, green sheets 11$a$ to 11$f$ become ceramic substrate members 1$a$ to 1$f$, and the other main surface 1$a$2 of ceramic substrate member 1$a$ and one main surface 1$b$1 of ceramic substrate member 1$b$ adjacent thereto are bonded with each other. Similarly, the other main surfaces 1$b$2 to 1$e$2 of ceramic substrate members 1$b$ to 1$e$ and one main surfaces 1$c$1 to 1$f$1 of ceramic substrate members 1$c$ to 1$f$ adjacent thereto are bonded with each other, respectively. Thereby, the main surfaces are bonded and six ceramic substrate members 1$a$ to 1$f$ are integrated, forming a stacked body 12. It should be noted that stacked body 12 is an LTCC multilayer substrate. Further, on this occasion, through vias 2, internal wires 3, side surface protection portions 7, and bottom surface protection portions 8 included in stacked body 12 are also sintered by firing. As described above, green sheets 11$a$ and 11$f$ serving as the first and second green sheets and green sheets 11$b$ and 11$e$ serving as the first and second inner layer green sheets are fired. Thereby, ceramic substrate members 1$a$ and 1$f$ serving as the first and second ceramic substrate members and ceramic substrate members 1$b$ and 1$e$ serving as the first and second inner layer ceramic substrate members are formed.

Next, main surface protection layers 9 are formed on externally exposed one main surface 1$a$1 of ceramic substrate member 1$a$ arranged at an outermost surface on one side in a stacking direction of entire stacked body 12, and on the externally exposed other main surface 1$f$2 of ceramic substrate member 1$f$ arranged at an outermost surface on the other side in the stacking direction, to cover these main surfaces. Main surface protection layer 9 is formed to cover immediately above side surface protection portion 7 and to be connected thereto.

As with internal wires 3 and the like, main surface protection layers 9 can be formed by any film formation method, and can be formed by screen printing, sputtering, or vapor deposition, for example. It should be noted that, when main surface protection layers 9 are formed by screen printing, it is preferable to form main surface protection layers 9 before firing green sheets 11$a$ to 11$f$. This can avoid main surface protection layers 9 from being heated twice and sintered.

Further, as with side surface protection portion 7 and bottom surface protection portion 8, main surface protection layer 9 is preferably formed of a material having a high resistance to a chemical agent used for etching, and is preferably formed of gold. However, main surface protection layer 9 does not need to have electrical conductivity. It should be noted that, in FIG. 7, main surface protection layers 9 are formed on entire regions other than the regions to serve as the gaps in a subsequent step, of one main surface 1$a$1 and the other main surface 1$f$2. However, if it is possible to narrow the plane area of each region to serve as the gap to some extent by forming the region by means of etching using laser or the like, main surface protection layers 9 do not need to be formed on entire regions other than the regions to serve as the gaps.

Figure 8:
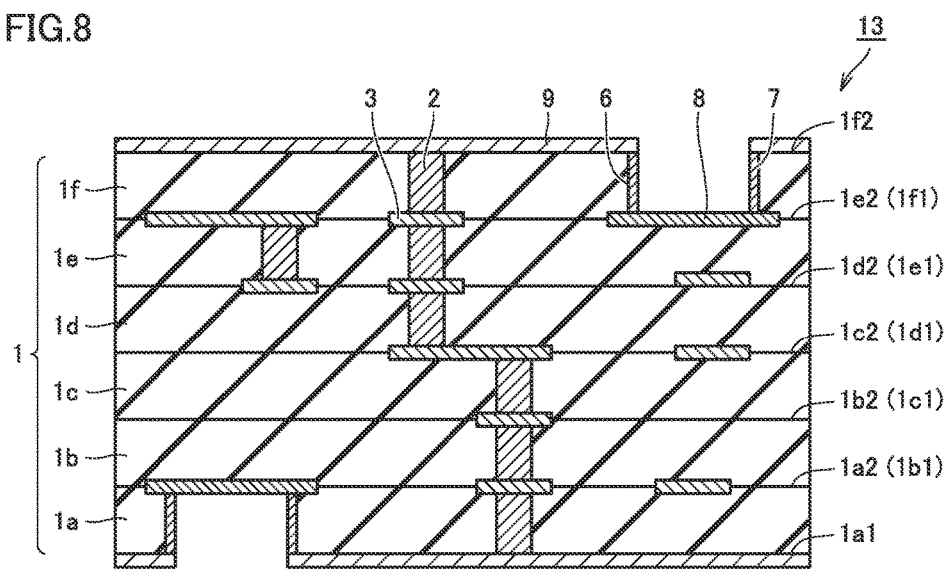
FIG. 8 is a schematic cross sectional view showing a fourth step of the method for manufacturing the ceramic substrate in the first embodiment.

Referring to FIG. 8, green sheets 11 are fired and become ceramic substrate members 1 in the step in FIG. 7, gap 6 is formed by etching and removing a portion of ceramic substrate member 1a, 1f in the region to serve as gap 6 surrounded by side surface protection portion 7. It should be noted that, on this occasion, the portion of ceramic substrate member 1a is etched and removed from one main surface 1a1 to the other main surface 1a2 to penetrate therethrough, and the portion of ceramic substrate member 1f is etched and removed from the other main surface 1f2 to one main surface 1a1 to penetrate therethrough (the starting point and the end point of etching may be opposite to those described above).

Here, it is preferable to use a solution which can etch alumina serving as the main constituent material for ceramic substrate members 1a and 1f, and whose etching rate for side surface protection portion 7, bottom surface protection portion 8, and main surface protection layer 9 is different from, that is, for example lower than, that for ceramic substrate members 1a and 1f, as an etching solution. In other words, it is preferable to form gap 6 by etching and removing the portion of ceramic substrate member 1a, 1f using a solution whose etching rate for side surface protection portion 7, bottom surface protection portion 8, and main surface protection layer 9 is sufficiently slower than the etching rate for alumina. Specifically, it is preferable to use a hydrofluoric acid-based solution, for example, as an etching solution.

When etching of the portion of ceramic substrate member 1a, 1f for forming gap 6, that is, the portion containing alumina and the like is performed under the above conditions, the etching stops at a position where a removed region of ceramic substrate member 1a, 1f reaches side surface protection portion 7 and bottom surface protection portion 8. In order to suppress etching of a portion containing alumina of ceramic substrate member 1a, 1f in a region on the outside of side surface protection portion 7 in plan view, bottom surface protection portion 8 is formed to extend to the outside of side surface protection portion 7. Conversely, an outer peripheral portion of side surface protection portion 7 is formed inside an outer peripheral portion of bottom surface protection portion 8. However, since side surface protection portion 7 is formed to cover only portions of the outer peripheral portion of gap 6 as described above, the outer peripheral portion of gap 6 is in direct contact with a portion of ceramic substrate member 1a, 1f, in some regions. Therefore, from that portion, etching of a portion of ceramic substrate member 1a, 1f on the outside of gap 6 may progress. Thus, in order to suppress this phenomenon, it is basically preferable that etching is time controlled.

In a case where a portion of ceramic substrate member 1a, 1f is removed until bottom surface protection portion 8 is exposed during the formation of gap 6, it is conceivable that etching progresses in a direction along the main surfaces of ceramic substrate member 1a, 1f (right-left direction of FIG. 8) by a distance nearly equal to the thickness of ceramic substrate member 1a, 1f (a dimension in an up-down direction of FIG. 8). Therefore, gap 6 has a pattern considering the above matter.

A thin film constituting side surface protection portion 7 has a role in protecting a region adjacent to side surface protection portion 7, and has a role as an upper surface reference portion when measuring the thickness of ceramic substrate member 1a, 1f on which it is formed. More specifically, by measuring a level difference between an uppermost surface of side surface protection portion 7 on a side of one main surface 1a1 or the other main surface 1f2 and a surface of bottom surface protection portion 8 within gap 6, a measured value of the level difference can be measured as the thickness of ceramic substrate member 1a, 1f.

It should be noted that, as shown in the drawings such as FIGS. 1 and 8, since bottom surface protection portion 8 actually has a thickness extending into gap 6, there may be a slight error between the thickness of ceramic substrate member 1a (distance from one main surface 1a1 to the other main surface 1a2) and the value obtained by the measurement of the above level difference. However, this error is negligible. Further, information needed as the thickness of ceramic substrate member 1a is a portion forming a capacitance, that is, a distance between the other main surface 1a2 and a surface of internal wire 3 facing the other main surface 1a2. Accordingly, desired information is sufficiently obtained by measuring the above level difference. This is because, since internal wire 3 and bottom surface protection portion 8 are basically the same layer formed simultaneously, the surface of internal wire 3 facing the other main surface lag and the surface of bottom surface protection portion 8 facing the other main surface 1a2 are located at a substantially equal position in the up-down direction of FIG. 8.

As described above, in the present embodiment, gap 6 is formed for measuring the thickness of each of ceramic substrate members 1a and 1f serving as the first and second ceramic substrate members. For that purpose, gap 6 preferably has a size which does not allow a semiconductor element or the like to be stored therein. Specifically, the maximum value of the width of gap 6 in plan view is preferably less than or equal to 1 mm.

Further, in the present embodiment, the step of forming gaps 6 is performed with one main surface 1a1 of ceramic substrate member 1a and the other main surface 1f2 of ceramic substrate member 1f being covered with main surface protection layers 9. This can suppress etching of a portion other than gap 6 of ceramic substrate member 1a, 1f during the etching of the portion of ceramic substrate member 1a, 1f for forming gap 6, and can suppress an unintended change in the thickness of the portion other than gap 6 of ceramic substrate member 1a, 1f. By forming gaps 6, a gap-provided stacked body 13 is formed.

Figure 9:
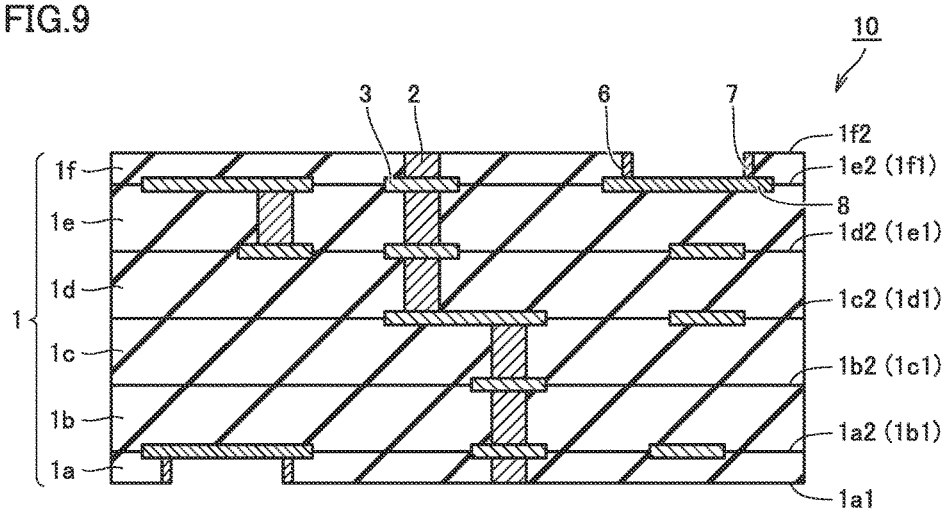
FIG. 9 is a schematic cross sectional view showing a fifth step of the method for manufacturing the ceramic substrate in the first embodiment.

Referring to FIG. 9, after the step of forming gaps 6, exposed main surfaces 1a1 and 1f2 of ceramic substrate members 1a and 1f serving as the first and second ceramic substrate members are polished. Thereby, main surface protection layers 9 on one main surface 1a1 and the other main surface 1f2 are removed, and the portions containing alumina of ceramic substrate members 1a and 1f are partially removed. The step of polishing ceramic substrate member 1a, 1f is performed while measuring the thickness of gap 6 and thereby measuring the thickness of ceramic substrate member 1a, 1f.

The measurement of the thickness of gap 6 is performed by measuring the level difference between the uppermost surface of side surface protection portion 7 and the surface of bottom surface protection portion 8 within gap 6, as described above. This measurement is preferably performed using an optical microscope or a level difference meter. By performing polishing while repeating measurement and polishing as described above, ceramic substrate member 1a, 1f can be polished with high accuracy to have a desired thickness. Accordingly, the value of a capacitance or the like of an internal circuit formed in ceramic substrate member 1a, 1f can be controlled with high accuracy.

It should be noted that, since shavings or an abrasive sticks to the inside of gap 6, the surface of side surface protection portion 7, and the like after ceramic substrate member 1a, 1f is polished, it is preferable to perform measurement while washing off such a substance with water, for example.

Referring to FIG. 3 again, if a plurality of gaps 6 for measuring the thickness of ceramic substrate member 1a, 1f are formed herein, in-plane distribution of the progress of polishing of ceramic substrate member 1a, 1f can be checked. Therefore, the amount to be polished can be adjusted with high accuracy for each portion of ceramic substrate member 1a, 1f in plan view, while checking the thickness of ceramic substrate member 1a, 1f at any time.

Referring to FIG. 1 again, next, electrodes 4 are formed in partial regions on one main surface 1a1 of ceramic substrate member 1a and on the other main surface 1f2 of ceramic substrate member 1f. Electrodes 4 can be formed by any film formation method, such as screen printing, sputtering, vapor deposition, or plating. It should be noted that, since main surfaces 1a1 and 1f2 which are polished surfaces are soiled by shavings and an abrasive immediately after the step of polishing in FIG. 9 is finished, it is preferable to wash main surfaces 1a1 and 1f2 with acetone or the like before forming electrodes 4.

In a case where an internal circuit is formed in ceramic substrate member 1, it is preferable to electrically separate electrode 4 from the protection layer, that is, side surface protection portion 7 and bottom surface protection portion 8 within gap 6, from the viewpoint of suppressing electrode 4 from affecting the internal circuit. In particular, in a case where gap 6 is finally arranged for each portion where an internal circuit is formed, it is preferable to give consideration as described above. However, in a case where each chip is cut out from gap 6 by dicing or the like in a final product, electrical connection cannot be established between electrode 4 and gap 6, and thus it is not necessary to give such consideration for gap 6.

By forming electrodes 4 as described above, final ceramic substrate 10 in the present embodiment is formed.

It should be noted that, in a case where ceramic substrate 10 is used as a sealing member for securing high airtightness for a silicon substrate or the like, electrode 4 is preferably formed as a dense film. In that case, electrode 4 is preferably formed by sputtering.

Next, the function and effect of the present embodiment will be described.

In the present embodiment, gap 6 is formed in each of ceramic substrate members 1a and 1f arranged at outermost surfaces on one side and the other side in a stacking direction of ceramic substrate 10, to penetrate therethrough. The inside of gap 6 is covered with a protection layer made of a material having an etching rate lower than that of ceramic substrate members 1a and 1f. Therefore, by observing a level difference caused by gap 6 with an optical microscope or the like, the thickness of gap 6, that is, the thickness of ceramic substrate member 1a, 1f can be measured with high accuracy. This is because, since ceramic substrate member 1a, 1f is suppressed from being unnecessarily etched in a region adjacent to gap 6, by being covered with the protection layer which is hard to be etched, the thickness of ceramic substrate member 1a, 1f is maintained unchanged within gap 6.

Other than the reason described above, one of the reasons why the thickness of gap 6 maintains the thickness of ceramic substrate member 1a, 1f with high accuracy in the present embodiment is that gap 6 is formed after firing the green sheets in the method for manufacturing ceramic substrate 10. More specifically, firing is performed by bonding the stacked green sheets with each other while applying pressure thereto. On this occasion, in particular in a case where zero shrinkage firing is performed, the amount of applied pressure is increased. This is because it is necessary in zero shrinkage firing to increase the amount of pressure applied from a direction intersecting with the main surfaces, in order to suppress the green sheets from shrinking in a direction along the main surfaces. On this occasion, the green sheets are deformed by the application of pressure to fill gap 6.

Generally, a gap is formed to store a semiconductor element or the like therein. In that case, the dimension of the gap is greater than that in the present embodiment, and thus deformation of the gap poses little problem. However, in the present embodiment, a gap having a smaller dimension than that for installing a semiconductor element is formed for measuring thickness instead of installing a semiconductor element. In this case, in particular the green sheet on a side of the bottom surface of gap 6 is deformed to be swollen to fill gap 6 as described above. Therefore, it may be difficult to accurately measure thickness using gap 6.

If firing is performed after forming a gap as described above, the amount of deformation of the gap may be increased. In contrast, if gap 6 is formed after firing as in the present embodiment, such deformation of gap 6 does not occur. Accordingly, accurate measurement of the thickness of ceramic substrate member 1a, 1f using gap 6 can be performed. Specifically, referring to FIG. 4 again, by setting the protrusion height of the side surface and the bottom surface within gap 6 to less than or equal to 2 μm, influence on the accuracy of the measurement of the thickness of ceramic substrate member 1a, 1f can be minimized. Thereby, while the error in thickness has conventionally been about ±50%, the error in thickness can be suppressed to less than or equal to ±5% according to the present embodiment.

As described above, according to the present embodiment, the thickness of ceramic substrate member 1a, 1f in ceramic substrate 10 after the stacking and after the firing can be measured with high accuracy. Accordingly, the value of a capacitance or the like of an internal circuit formed in ceramic substrate member 1a, 1f can be controlled with high accuracy. Therefore, specifications of the internal circuit formed in ceramic substrate member 1a, 1f or the like can be controlled as designed, and an error from a designed value can be reduced. Thus, the accuracy and reliability of the entire module formed using ceramic substrate members 1a and 1f can be further improved.

The thickness of ceramic substrate member 1a, 1f can be measured using gap 6, not only during the process of manufacturing ceramic substrate 10 such as immediately after the firing, but also after completion thereof, and further after this is diced and embedded into a module, for example. Thereby, the properties of the internal circuit embedded in ceramic substrate 10 can also be checked while the module is used.

Second Embodiment

Figure 10:
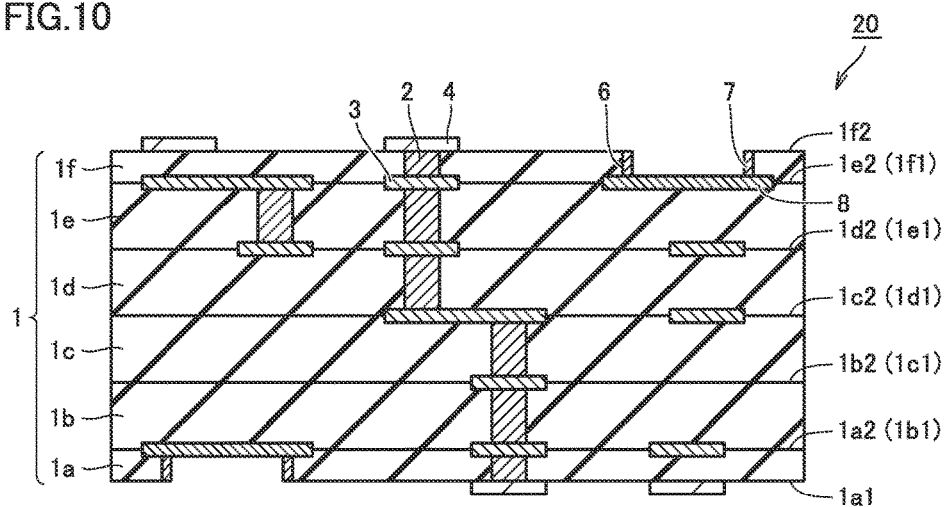
FIG. 10 is a schematic cross sectional view showing a configuration of a ceramic substrate in a second embodiment.
Figure 11:
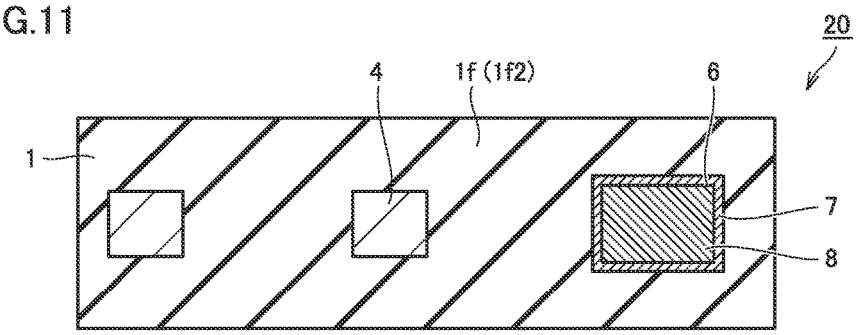
FIG. 11 is a schematic plan view showing a manner in which the ceramic substrate of FIG. 10 is viewed from the top in plan view.

First, a configuration of a ceramic substrate in the present embodiment will be described using FIGS. 10 to 11. Referring to FIGS. 10 and 11, since a ceramic substrate 20 in the present embodiment has basically the same configuration as that of ceramic substrate 10, components corresponding to the same components as those of ceramic substrate 10 will be designated by the same reference numerals as those of ceramic substrate 10. Further, concerning a part in the present embodiment which is identical in manner or the like to that in the first embodiment, the description thereof will not be repeated here.

In ceramic substrate 20 in the present embodiment, in particular, side surface protection portion 7 covering the side surface within gap 6 formed in particular in ceramic substrate member 1a, 1f is formed to entirely cover the side surface within gap 6. Therefore, in the present embodiment, side surface protection portion 7 and bottom surface protection portion 8 serving as the protection layer within gap 6 entirely cover the side surface and the bottom surface within gap 6. In this respect, the present embodiment has a configuration different from that in the first embodiment in which side surface protection portion 7 serving as the protection layer covers at least a portion of the side surface within gap 6.

More specifically, in the present embodiment, side surface protection portion 7 extends continuously along the entire outer peripheral portion of gap 6 in plan view. In other words, it can be said that side surface protection portion 7 or bottom surface protection portion 8 serving as the protection layer is always sandwiched between gap 6 and the portion containing alumina of ceramic substrate member 1 in the present embodiment.

Next, a method for manufacturing ceramic substrate 20 in the present embodiment will be described using FIGS. 12 to 16. It should be noted that, concerning a part which is identical in content to that in the method for manufacturing ceramic substrate 10 the first embodiment, the description thereof will not be repeated here.

Figure 12:
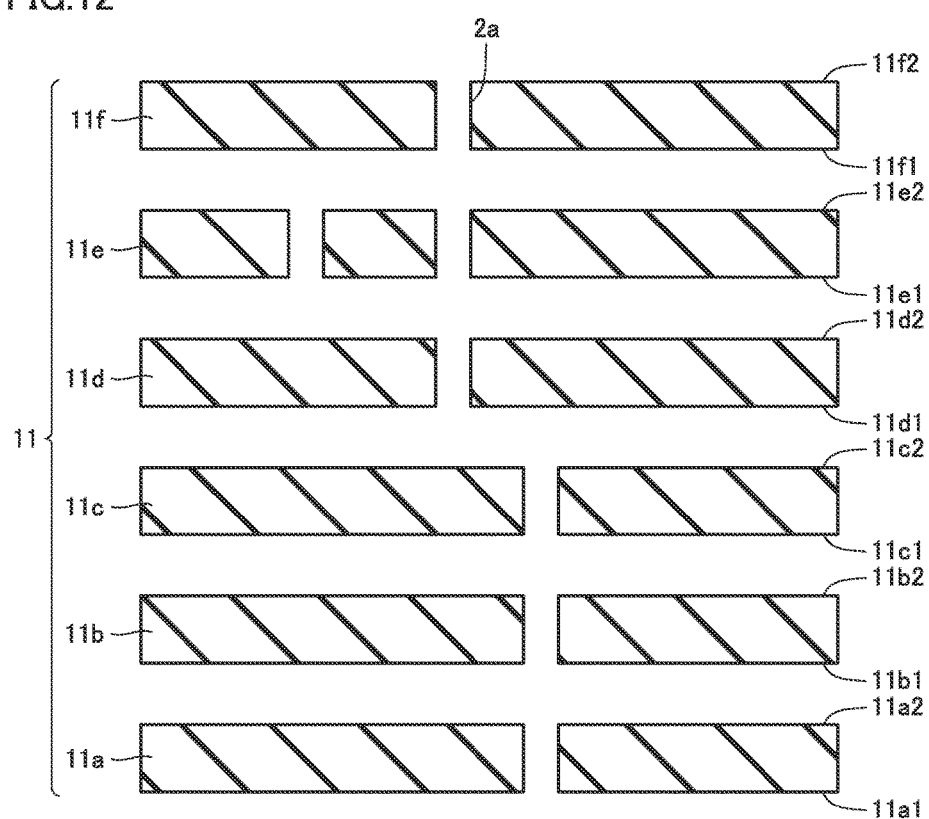
FIG. 12 is a schematic cross sectional view showing a first step of a method for manufacturing the ceramic substrate in the second embodiment.

Referring to FIG. 12, first, green sheets 11a to 11f are prepared as in the first embodiment (see FIG. 5). However, at this point of time, protection portion through hole 7a is not formed, although through holes 2a are formed as in the first embodiment. Although protection portion through hole 7a is not formed, a region to serve as gap 6 in green sheet 11a, 11f is recognized at this point of time.

Figure 13:
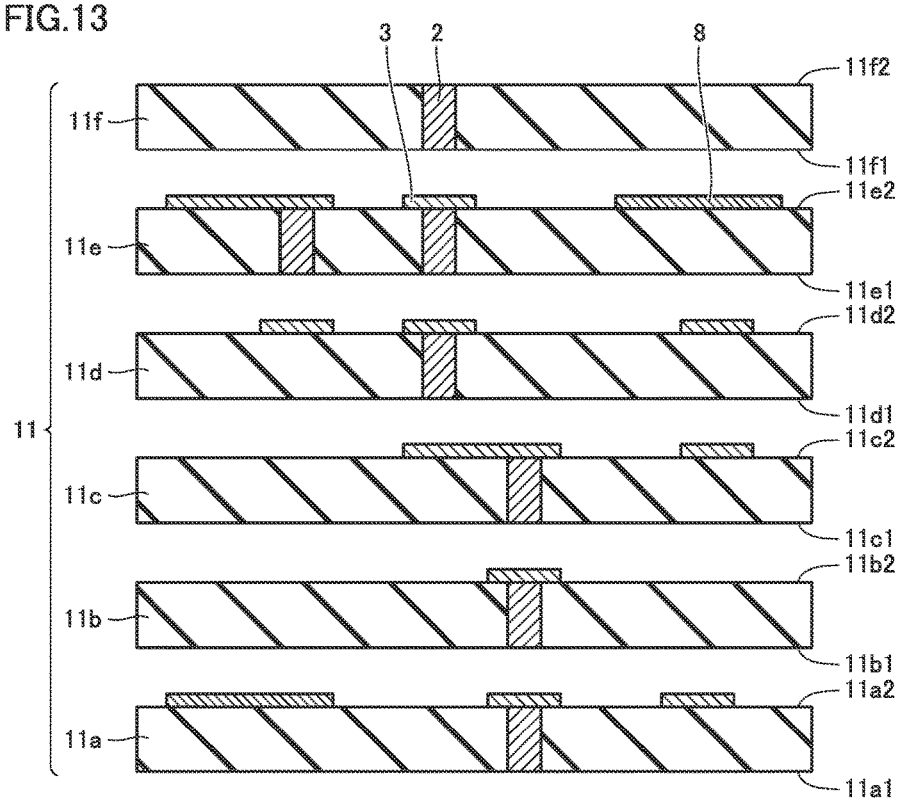
FIG. 13 is a schematic cross sectional view showing a second step of the method for manufacturing the ceramic substrate in the second embodiment.

Referring to FIG. 13, the conductive member is charged into through holes 2a and thereby through vias 2 are formed, and internal wires 3 are formed, as in the first embodiment (see FIG. 6).

Figure 14:
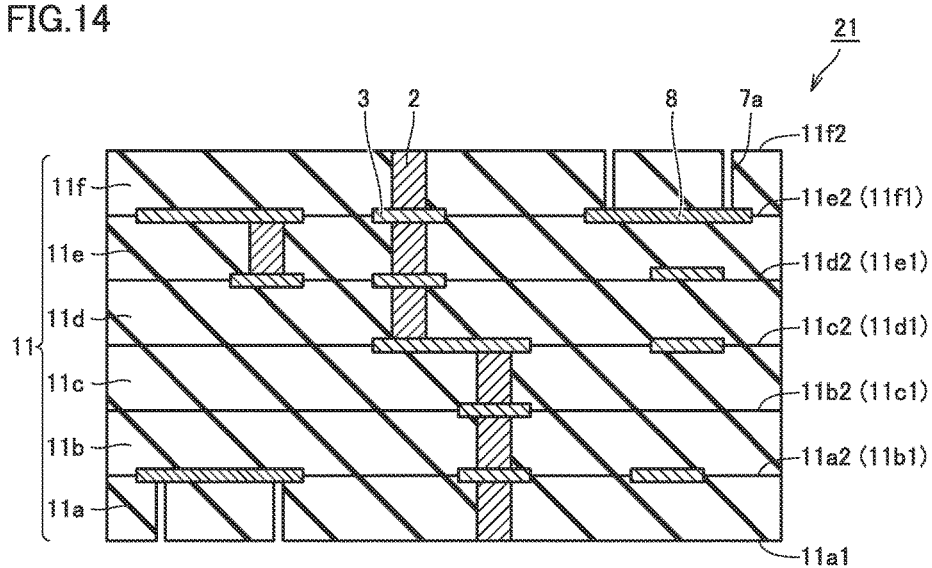
FIG. 14 is a schematic cross sectional view showing a third step of the method for manufacturing the ceramic substrate in the second embodiment.

Referring to FIG. 14, next, the plurality of green sheets 11a, 11b, 11c, 11d, 11e, and 11f are stacked in this order, from the lower side to the upper side in the drawing, as in the first embodiment (see FIG. 7). After they are stacked, protection portion through hole 7a for forming side surface protection portion 7 (see FIG. 10) is formed at the outer peripheral portion in plan view of the region to serve as gap 6 (see FIG. 10) in each of green sheet 11a and green sheet 11f. Protection portion through hole 7a is formed at a portion inside the outermost portion of bottom surface protection portion 8 in the right-left direction of FIG. 10 in plan view. In green sheet 11a, protection portion through hole 7a is formed to reach the other main surface 11a2 from one main surface 11a1 thereof, and in green sheet 11f, protection portion through hole 7a is formed to reach one main surface 11f1 from the other main surface 11f2 thereof. Here, the other main surface 11a2 and one main surface 11b1 are already in close contact with each other, and the other main surface 11e2 and one main surface 11f1 are already in close contact with each other. Therefore, protection portion through holes 7a reaching the other main surface 11a2 and one main surface 11f1 reach bottom surface protection portions 8.

Protection portion through hole 7a is formed to extend along the entire outer peripheral portion of the region to serve as gap 6 in plan view. Although protection portion through hole 7a is formed for example by laser in the present embodiment, punching may be used if the processing of protection portion through hole 7a can be accurately controlled to stop at a position where it reaches the surface of bottom surface protection portion 8. In a case where the processing is performed using laser, the material constituting bottom surface protection portion 8 is preferably a material having a laser absorption wavelength significantly different from that of the material constituting green sheets 11, from the viewpoint of stopping the progress of the laser at the position where the laser reaches the surface of bottom surface protection portion 8 immediately below green sheet 11a, 11f.

Figure 15:
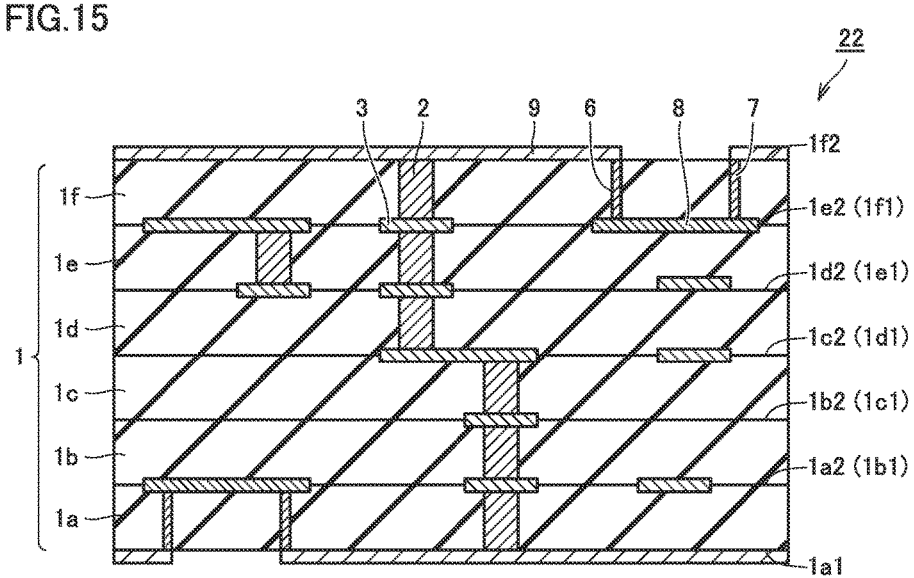
FIG. 15 is a schematic cross sectional view showing a fourth step of the method for manufacturing the ceramic substrate in the second embodiment.

Referring to FIG. 15, next, the conductive member is charged into protection portion through holes 7a by screen printing, for example. Thereby, side surface protection portion 7 reaching the other main surface 11a2, 11f2 from one main surface 11a1, 11f1 of green sheet 11a, 11f is formed. Further, main surface protection layers 9 are formed on one main surface 1a1 and on the other main surface 1f2, to cover these main surfaces. Main surface protection layers 9 can be formed by screen printing, sputtering, or vapor deposition, for example. However, it is more preferable to use screen printing, because main surface protection layers 9 are formed on the green sheets. It should be noted that side surface protection portions 7 and main surface protection layers 9 may be collectively formed by screen printing by screen printing, for example.

Next, stacked green sheets 11a to 11f are co-fired at a temperature of less than or equal to 1000° C. while applying pressure thereto, and thereby a stacked body 22 is formed.

It should be noted that, as a variation of the above procedure, main surface protection layers 9 may be formed by sputtering or vapor deposition, after the firing, in the present embodiment.

In addition, the step of firing may be performed immediately after the step of stacking. In a case where the step of firing is performed immediately after the step of stacking, protection portion through holes 7a on bottom surface protection portions 8 are formed after the stacking and the firing, and thereafter side surface protection portions 7 and main surface protection layers 9 are formed. In a case where side surface protection portions 7 and main surface protection layers 9 are formed by screen printing, it is necessary to apply heat again to stacked body 22 after side surface protection portions 7 and main surface protection layers 9 are formed.

At any rate, in the present embodiment, the step of forming side surface protection portions 7 in FIG. 15 is performed after the step of stacking in FIG. 14. Further, side surface protection portion 7 is formed to entirely cover the outer peripheral portion of the region to serve as gap 6.

Figure 16:
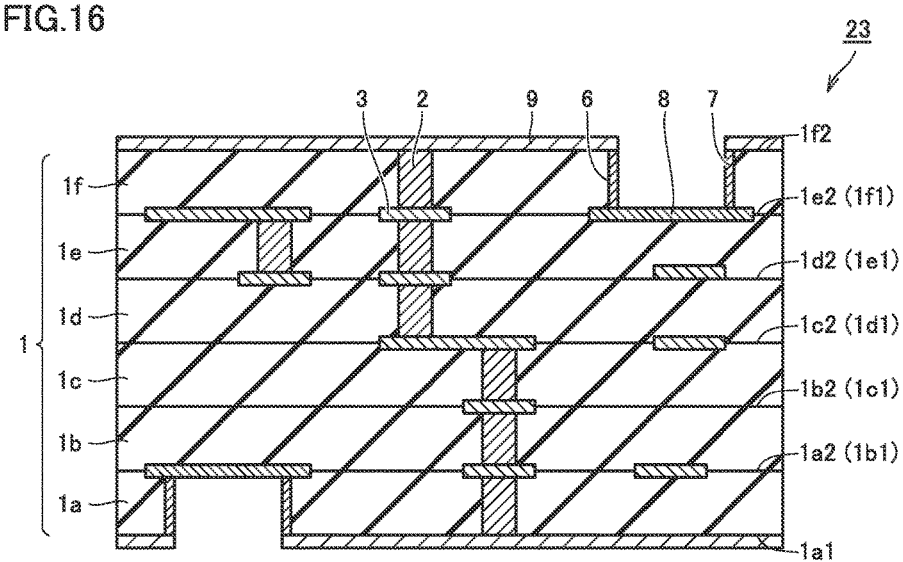
FIG. 16 is a schematic cross sectional view showing a fifth step of the method for manufacturing the ceramic substrate in the second embodiment.

Referring to FIG. 16, gaps 6 are formed, and thereby a gap-provided stacked body 23 is formed, as with the step in FIG. 8. The subsequent steps are basically the same as the step shown in FIG. 9 and the steps subsequent thereto in the first embodiment, and thereby main surfaces 1a1 and 1f2 are polished and electrodes 4 are formed. Thus, final ceramic substrate 20 in the present embodiment is formed.

Next, the function and effect of the present embodiment will be described. Besides the same function and effect as those of the first embodiment, the present embodiment has the function and effect described below.

In the present embodiment, the side surface and the bottom surface within gap 6 are entirely covered with side surface protection portion 7 or bottom surface protection portion 8 serving as the protection layer. Such a configuration can suppress occurrence of unintentional etching from gap 6 to a region outside the region to serve as gap 6 during the etching for forming gap 6, and resultant changes in thickness and the like of the region, more reliably than that of the first embodiment in which side surface protection portion 7 covers only portions of the side surface within gap 6. Therefore, in the present embodiment, the dimension of gap 6 can be accurately controlled, and a defect such as a change in the thickness of green sheet 11a, 11f due to etching can be reliably suppressed, when compared with the first embodiment.

The above configuration can be formed by forming the side surface protection portion (in particular, protection portion through hole 7a) after stacking the green sheets. This is because, even when protection portion through hole 7a is formed to surround the entire outer peripheral portion of the region to serve as gap 6, green sheet 11b, 11e is present immediately therebelow in a closely contacting manner and thus suppresses dropping off of the region to serve as gap 6, and thereby protection portion through hole 7a with a desired width can be formed with a portion of the green sheet containing alumina and the like being left in the region to serve as gap 6.

Third Embodiment

Figure 17:
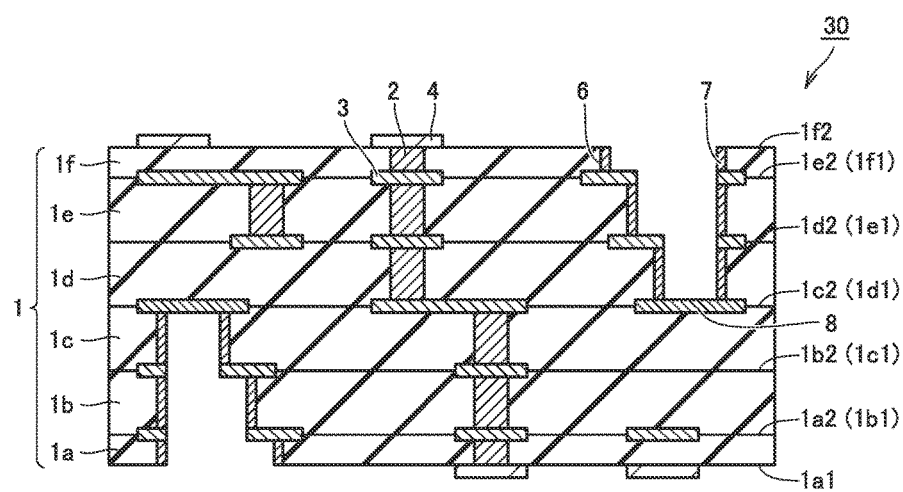
FIG. 17 is a schematic cross sectional view showing a configuration of a ceramic substrate in a third embodiment.

First, a configuration of a ceramic substrate in the present embodiment will be described using FIG. 17. Referring to FIG. 17, since a ceramic substrate 30 in the present embodiment has basically the same configuration as that of ceramic substrate 10, components corresponding to the same components as those of ceramic substrate 10 will be designated by the same reference numerals as those of ceramic substrate 10. Further, concerning a part in the present embodiment which is identical in manner or the like to that in the first embodiment, the description thereof will not be repeated here.

In ceramic substrate 30 in the present embodiment, not only ceramic substrate members 1a and 1f arranged at the outermost surfaces on the one side and the other side in the stacking direction of ceramic substrate members 1, but all of ceramic substrate members 1a to 1f each have gap 6 penetrating from the one main surface to the other main surface thereof.

Specifically, lower left gap 6 in the drawing extends in a depth direction (up-down direction of FIG. 17) from one main surface 1a1 to the other main surface 1a2 of ceramic substrate member 1a, from one main surface 1b1 to the other main surface 1b2 of ceramic substrate member 1b adjacent thereto, and from one main surface 1c1 to the other main surface 1c2 of ceramic substrate member 1c adjacent thereto. Accordingly, gap 6 is formed to continuously penetrate the inside of ceramic substrate members 1a, 1b, and 1c in the depth direction. Similarly, upper right gap 6 in the drawing extends in the depth direction from the other main surface 1f2 to one main surface 1f1 of ceramic substrate member 1f, from the other main surface 1e2 to one main surface 1e1 of ceramic substrate member 1e adjacent thereto, and from the other main surface 1d2 to one main surface 1d1 of ceramic substrate member 1d adjacent thereto. Accordingly, gap 6 is formed to continuously penetrate the inside of ceramic substrate members 1f, 1e, and 1d in the depth direction.

Gap 6 penetrating ceramic substrate members 1a, 1b, and 1c is formed such that its width in the right-left direction of FIG. 17 is decreased as it extends from the side of ceramic substrate member 1a which is the outermost surface, in the depth direction, that is, to the side of ceramic substrate member 1c. More specifically, the width of gap 6 in ceramic substrate member 1b is smaller than the width of gap 6 in ceramic substrate member 1a, and the width of gap 6 in ceramic substrate member 1c is smaller than the width of gap 6 in ceramic substrate member 1b. Similarly, gap 6 penetrating ceramic substrate members 1f, 1e, and 1d is formed such that its width in the right-left direction of FIG. 17 is decreased as it extends from the side of ceramic substrate member 1f which is the outermost surface, in the depth direction, that is, to the side of ceramic substrate member 1d.

It should be noted that, in FIG. 17, gap 6 penetrating ceramic substrate members 1a to 1c which are lower three layers and gap 6 penetrating ceramic substrate members d to 1f which are upper three layers, of all the six stacked layers of ceramic substrate members 1a to 1f, are formed. However, the present invention is not limited to such a manner, and gap 6 penetrating four layers from the uppermost layer and gap 6 penetrating two layers from the lowermost layer may be formed, for example. Further, all ceramic substrate members 1a to 1f do not have to be penetrated by any gap 6, and if gap 6 penetrates at least two or more layers of ceramic substrate members, gap 6 falls within the scope of the present embodiment.

As described above, in the present embodiment, gap 6 is formed to penetrate the inside of ceramic substrate member 1a serving as the first ceramic substrate member and ceramic substrate members 1b and 1c serving as a plurality of inner layer ceramic substrate members arranged on the other side in the stacking direction with respect to ceramic substrate member 1a, of the plurality of stacked ceramic substrate members 1a to 1f. Further, gap 6 is formed to penetrate the inside of ceramic substrate member 1f serving as the second ceramic substrate member and ceramic substrate members 1e and 1d serving as a plurality of inner layer ceramic substrate members arranged on the one side in the stacking direction with respect to ceramic substrate member 1f. At a boundary portion between layers of the plurality of ceramic substrate members through which gap 6 penetrates, a level difference is provided such that the width of gap 6 is changed.

Next, the function and effect of the present embodiment will be described. Besides the same function and effect as those of the first embodiment, the present embodiment has the function and effect described below.

In the present embodiment, gap 6 extending in the depth direction is formed to penetrate not only ceramic substrate member 1a, if arranged on the outermost surface side, but also ceramic substrate member 1b, 1e arranged deeper in the stacking direction (the depth direction) than ceramic substrate member 1a, 1f, and further also ceramic substrate member 1c, 1d. Accordingly, thicknesses of not only ceramic substrate members 1a and if but also ceramic substrate members 1b to 1e can be measured. Since a level difference is provided such that the width of gap 6 is changed for each layer of green sheet, the thickness for each layer can be measured by observing the level difference.

An internal circuit formed in ceramic substrate 30 using internal wire 3 can be formed in not only ceramic substrate member 1a, 1f on the outermost surface side, but also each of ceramic substrate members 1b to 1e arranged inside thereof. Accordingly, the capability of providing gap 6 in each of ceramic substrate members 1b to 1e and measuring the thickness of each of ceramic substrate members 1b to 1e using gap 6 after the stacking and the firing as in the present embodiment leads to the capability of reducing an error from a designed value of a capacitance or the like of the internal circuit formed in each of ceramic substrate members 1b to 1e.

It should be noted that, even when the thicknesses of green sheets 11b to 11e are measured before the stacking, the thicknesses of ceramic substrate members 1b to 1e after the stacking and the firing become different from the original thicknesses of green sheets 11b to 11e. In particular in the case of zero shrinkage firing, shrinkage of the green sheets in a lateral direction along the main surfaces is limited, whereas shrinkage in a thickness direction intersecting with the main surfaces is increased, and thus the thicknesses thereof have a significant change between before and after the firing. Thus, the accuracy and reliability of finally obtained ceramic substrate 30 and the entire module using ceramic substrate 30 can be further improved by accurately measuring the thicknesses of ceramic substrate members 1b to 1e again after the stacking and the firing, using gaps 6.

The features described in (the examples included in) the embodiments described above may be applied to be combined as appropriate in a technically consistent scope.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST 1, 1a, 1b, 1c, 1d, 1e, 1f ceramic substrate member; 1a1, 1b1, 1c1, 1d1, 1e1, 1f1, 11a1, 11b1, 11c1, 11d1, 11e1, 11f1: one main surface; 1a2, 1b2, 1c2, 1d2, 1e2, 1f2, 11a2, 11b2, 11c2, 11d2, 11e2, 11f2: the other main surface; 2: through via; 2a: through hole; 3: internal wire; 4: electrode; 6: gap; 7: side surface protection portion; 7a: protection portion through hole; 8: bottom surface protection portion; 9: main surface protection layer; 10, 20: ceramic substrate; 11, 11a, 11b, 11c, 11d, 11e, 11f: green sheet; 12, 22: stacked body; 13, 23: gap-provided stacked body.

The invention claimed is:

1. A ceramic substrate comprising a plurality of stacked ceramic substrate members each having one main surface and the other main surface opposite to the one main surface, wherein
each of the plurality of ceramic substrate members includes a via reaching the other main surface from the one main surface,
a gap is formed in each of first and second ceramic substrate members of the plurality of stacked ceramic substrate members to penetrate each of the first and second ceramic substrate members, the first ceramic substrate member being arranged at an outermost surface on one side in a stacking direction of the ceramic substrate members, the second ceramic substrate member being arranged at an outermost surface on the other side opposite to the one side in the stacking direction,
a protection layer entirely covers a side surface and a bottom surface within the gap, and
the protection layer is made of a material having an etching rate lower than that of the ceramic substrate members.

2. The ceramic substrate according to claim 1, wherein the gap is formed to penetrate inside of the first ceramic substrate member and a plurality of inner layer ceramic substrate members arranged on the other side in the stacking direction with respect to the first ceramic substrate member, of the plurality of stacked ceramic substrate members, and
the gap is formed to penetrate inside of the second ceramic substrate member and a plurality of inner layer ceramic substrate members arranged on the one side in the stacking direction with respect to the second ceramic substrate member, of the plurality of stacked ceramic substrate members.

3. The ceramic substrate according to claim 1, wherein an electrode is formed on each of the one main surface of the first ceramic substrate member arranged on the one side and the other main surface of the second ceramic substrate member arranged on the other side, and
the protection layer is electrically separated from the electrode.

4. The ceramic substrate according to claim 1, wherein a plurality of the gaps are formed in each of the first and second ceramic substrate members, in plan view.

5. The ceramic substrate according to claim 1, wherein the protection layer includes a side surface protection portion covering the side surface within the gap, and a bottom surface protection portion covering the bottom surface within the gap, of the protection layer, and
the bottom surface protection portion extends more outward than the side surface protection portion, in plan view.

6. The ceramic substrate according to claim 1, wherein a maximum value of a width of the gap in plan view is less than or equal to 1 mm.

7. The ceramic substrate according to claim 1, wherein a protrusion height of the side surface within the gap and the bottom surface within the gap is less than or equal to 2 μm.

8. The ceramic substrate according to claim 1, wherein the protection layer is any material selected from the group consisting of the group consisting of gold, platinum, silver, and copper.

9. A method for manufacturing a ceramic substrate, comprising:
preparing first and second green sheets each having one main surface and the other main surface opposite to the one main surface, a first inner layer green sheet which can be stacked to be adjacent on a side of the other main surface of the first green sheet, and a second inner layer green sheet which can be stacked to be adjacent on a side of the one main surface of the second green sheet;
forming a via reaching the other main surface from the one main surface, in each of the first and second green sheets and the first and second inner layer green sheets;
forming a side surface protection portion reaching the other main surface from the one main surface of each of the first and second green sheets, at an outer peripheral portion of a region to serve as a gap;
forming a bottom surface protection portion to include an entire region to be surrounded by the side surface protection portion in plan view, to be able to be adjacent on a side of the side surface protection portion closer to the first or second inner layer green sheet;
stacking the first and second green sheets and the first and second inner layer green sheets;
firing the first and second green sheets and the first and second inner layer green sheets, and thereby forming first and second ceramic substrate members and first and second inner layer ceramic substrate members; and after the firing, etching and removing a portion of each of the first and second ceramic substrate members in the region to serve as the gap surrounded by the side surface protection portion, and thereby forming the gap penetrating each of the first and second ceramic substrate members, wherein the side surface protection portion and the bottom surface protection portion are made of a material having an etching rate lower than that of the first and second ceramic substrate members.

10. The method for manufacturing the ceramic substrate according to claim 9, wherein the forming of the gap is performed with the one main surface of the first ceramic substrate member and the other main surface of the second ceramic substrate member being each covered with a main surface protection layer.

11. The method for manufacturing the ceramic substrate according to claim 9, further comprising polishing an exposed main surface of each of the first and second ceramic substrate members, after the forming of the gap, wherein the polishing is performed while measuring a thickness of the gap.

12. The method for manufacturing the ceramic substrate according to claim 9, wherein the gap is formed for measuring a thickness of each of the first and second ceramic substrate members.

13. The method for manufacturing the ceramic substrate according to claim 9, wherein the forming of the side surface protection portion is performed before the stacking, and the side surface protection portion is formed to cover only portions of the outer peripheral portion of the region to serve as the gap.

14. The method for manufacturing the ceramic substrate according to claim 9, wherein the forming of the side surface protection portion is performed after the stacking, and the side surface protection portion is formed to entirely cover the outer peripheral portion of the region to serve as the gap.

15. The method for manufacturing the ceramic substrate according to claim 9, wherein the etching and removing of a portion of each of the first and second ceramic substrate members is performed using a hydrofluoric acid-based solution whose etching rate for the side surface protection portion and the bottom surface protection portion is different from that for the first and second ceramic substrate members.

* * * * *